United States Patent [19]

Hahm et al.

[11] Patent Number: 5,058,064
[45] Date of Patent: Oct. 15, 1991

[54] MEMORY DEVICE HAVING ADDRESS CONTROL FUNCTION

[75] Inventors: Jin H. Hahm, Daeduk; Sang J. Kim, Yusung, both of Rep. of Korea

[73] Assignee: Electronics and Tekcommunications Research Institute, Rep. of Korea

[21] Appl. No.: 455,277

[22] Filed: Dec. 22, 1989

[30] Foreign Application Priority Data

Dec. 23, 1988 [KR]  Rep. of Korea ............... 1988-17365

[51] Int. Cl.$^5$ .............................................. G11C 13/00
[52] U.S. Cl. ........................... 365/189.01; 365/189.08; 365/230.08
[58] Field of Search ...................... 365/189.01, 189.05, 365/189.07, 189.08, 230.08

[56] References Cited
U.S. PATENT DOCUMENTS 4,849,938  7/1989  Furutani et al. .................... 365/200

Primary Examiner—Terrell W. Fears

[57] ABSTRACT

A memory device having unmultiplexed address inputs for performing an address control function including an address control input (AC) port, address inputs and an address arithmetic unit which performs the address control function by summing up these inputs. These units are connected such that the summed address of the address inputs and the address control input is applied to the memory as the actual address. Also provided is a memory device having multiplexed address inputs for performing an address control function including an address control input (AC) port, a row address select input (RAS) port, and an address arithmetic unit for performing an address control function by controlling these ports. The ports are connected such that, when considering the address actually applied from the multiplexed address input, the address control input (AC), and the row address select input (RAS), if the RAS signal was applied, the sum of the row address select input and the address control input (AC) is applied to the memory as the actual lower address, and if the column address select input (CAS) was applied, the sum of the address input and the carry produced by lower address is applied to the memory as the actual upper address.

3 Claims, 5 Drawing Sheets

Fig. 1-a
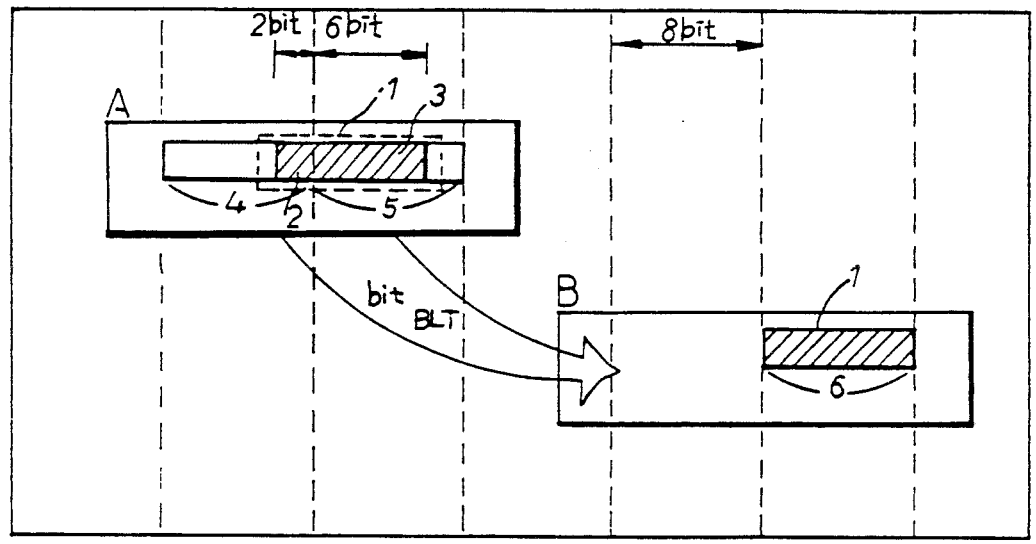
Fig. 1-b
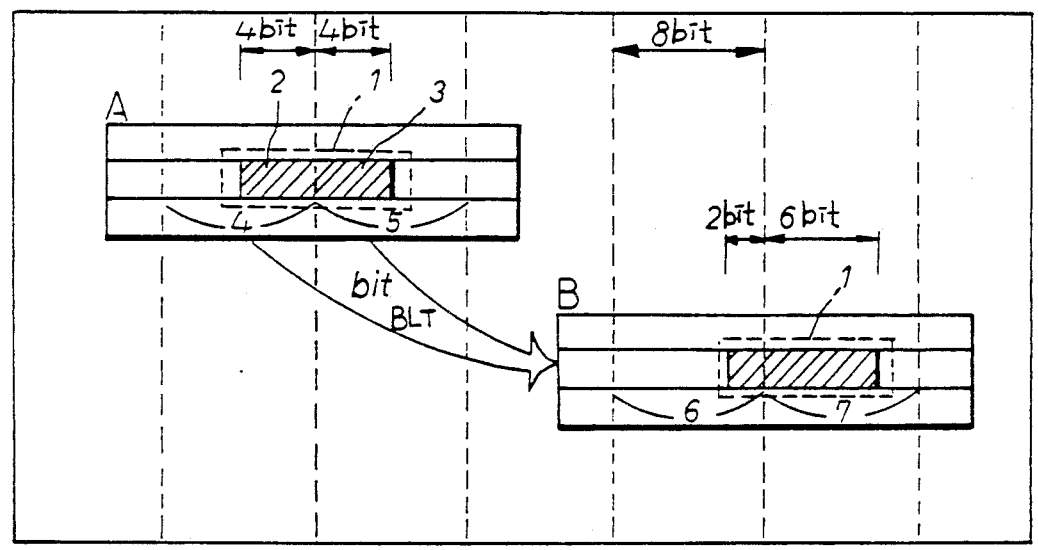

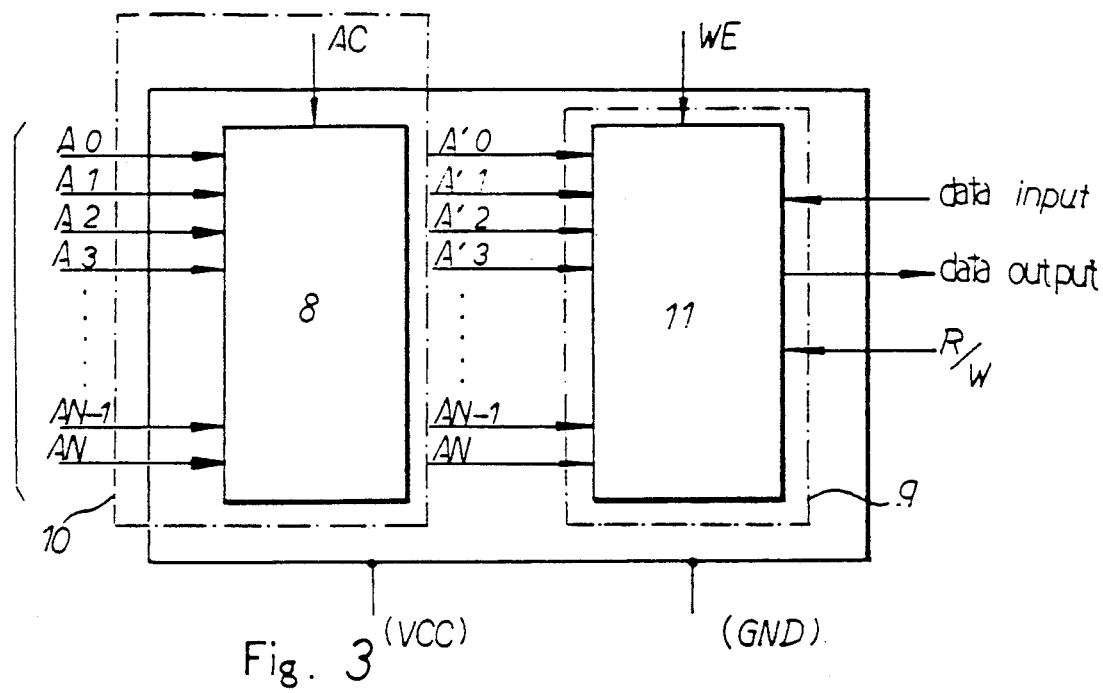
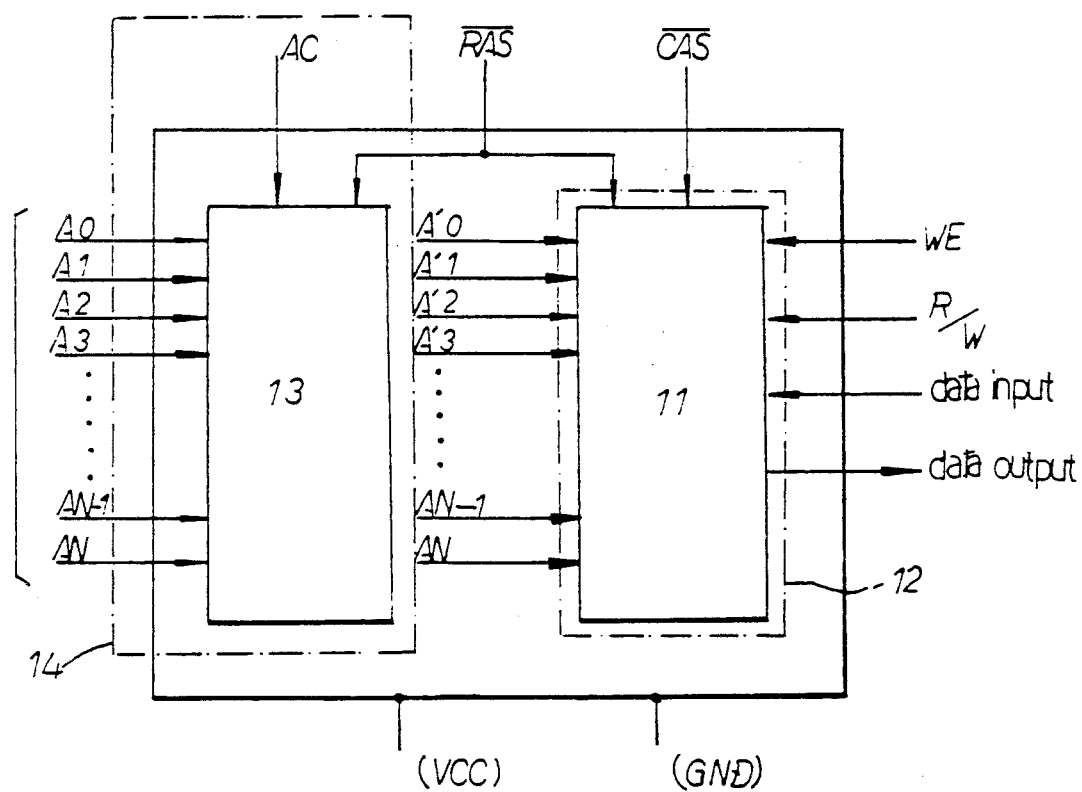

MEMORY DEVICE HAVING ADDRESS CONTROL FUNCTION

BACKGROUND OF THE INVENTION

This invention relates to computer memory devices having address control function. By constructing a bitmap plane using these memory devices, the data transfer speed between bitmap areas can be improved because the data can be read and written with 8 bits or 16 bits width regardless the byte boundary in the bitmap plane.

While computer techniques have been developed on the basis of the numeric and character data processing hitherto, recently, due to the enhancement of the processing capacity of microprocessors and to the drop in price of memory chips, there is being developed a type of workstation which can process image information in addition to color information.

Since the workstations generally employ color and monochrome high resolution monitors having resolution of the degree of 1000 pixels×1000 pixels instead of ASCII terminals which can display only the character information, it necessarily requires the functions for processing a large number of image informations at high speed.

One of such image processing functions is BITBLT(-BIT Boundary Block Transfer) function, that is, function of transferring data in the particular area of the bitmap consisting of a number of memories to the other area.

In the workstation, window function or graphic function is performed by means of such BITBLT function, and the processing speed in performing such BITBLT function is an important factor in determining the general performance of workstation. Accordingly, in general, the appropriate graphic pocessors are used in workstations in order to enhance the image processing speed.

However, because the conventional memory devices have been developed with the type suitable to process character information as a unit of byte, in the case of construction of bitmaps with these memories, CPU(-Central Processing Unit) or graphic processor can handle only 8 bit or 16 bit data corresponding to same address simultaneously. So, in order to extract the useful data from it, CPU or graphic processor must pick out the desired data by shifting 8 bit or 16 bit data left or right. Because the processing procedures become more complex, the processing speed and the efficiency are degraded.

DESCRIPTION OF PRIOR ART

An embodiment of such processing procedures will be described with reference to FIG. 1-a which shows a flow of BITBLT process in the bitmap formed by conventional 8 bit memories. In FIG. 1-a, vertical dotted lines designate the boundaries of bytes in which 1 byte consists of 8 bits. The reference numeral 1 designates 8 bit data D, 2 designates the area assigned to the address aaaa of the data D, 3 designates the area assigned to the address aaaa+1 of the data D, 4 designates the address aaaa, 5 designates the address aaaa+1, and 6 designates the address bbbb.

The bitmap for displaying or storing image information, consisting of the conventional memory devices, that is, the 64K×1 or 256K×1 memory device is shown in FIG. 1-a. CPU or graphic processor for controlling such a bitmap is designed such that n×8-bit data for one address (n is integer) are processed simultaneously, and transfers the data 1 in the area A of the bitmap to the area B through the following procedures.

Firstly, by CPU or graphic processor, the 8-bit data of the address aaaa (4) in the area A read out and then stored into the registher X, and then the stored data are shifted left by 6-bits. The remaining 2-bit data being again stored into register X. Subsequently, 8-bit data in the address aaaa+1 (5) are read out and then stored into the register Y, and then the stored data are shifted right by 2-bits, the remaining 6-bit data (3) being stored again into register Y.

Then, after the stored data in the registers X and Y processed by ORing are stored into the register Z, the data 1 stored in register Z are written into the address bbbb (6) of the area B. Subsequently, after the address aaaa (4) and the address bbbb (6) are increased by one address respectively, the above described procedures are performed repeatedly until all the data in the area A are transferred into the area B.

Thus, because the procedures of processing image by means of the conventional memory device comprise the step of shifting data and the step of temporarily storing data and then again combining data. It is disadvantageous that the speed and efficiency in processing of data degrade.

SUMMARY OF THE INVENTION

To solve the above described problems caused by constituting the bitmap using conventional memories, in the bitmap formed by new memory device according to the invention in which address control function is added to the conventional memory devices of two types having multiplexed or unmultiplexed address inputs respectively, when BIT boundary block transfering the data in the area A to the area B, 8 bit data for the successive addresses in the area A are read out simultaneously, and the read out data are written into the area B in the same manner, so that the number of times of reading/writing of data are reduced, and the shift operation in the register of CPU or graphic processor becomes unnecessary, thereby improving the speed in BITBLT processing and total efficiency in image processing.

Accordingly, the present invention, as means for accomplishing the above described objects, provides a memory device having unmultiplexed address inputs which comprises means for performing address control function consisting of an address control input (AC) port, address inputs and an address arithmetic unit which performs the address control function by summing up these inputs, which are connected such that the summed address of the address inputs and the address control input is applied to the memory as the actual address. The present invention also provides a memory device having multiplexed address inputs which comprises means for performing address control function consisting of a address control input (AC) port, a row address select input (RAS) port, and an address arithmetic unit for performing address control function by controlling of these ports, which are connected such that, when considering the address actually applied from the multiplexed address input, the address control input (AC), and the row address select input (RAS), if RAS signal was applied, the sum of the row address select input and the address control input (AC) is applied to the memory as the actual lower address, and if the column address select input (CAS) was applied, the sum of the address input and the carry produced by lower address is applied to the memory as the actual upper address.

DETAILED DESCRIPTION OF THE INVENTION

Figure 4:
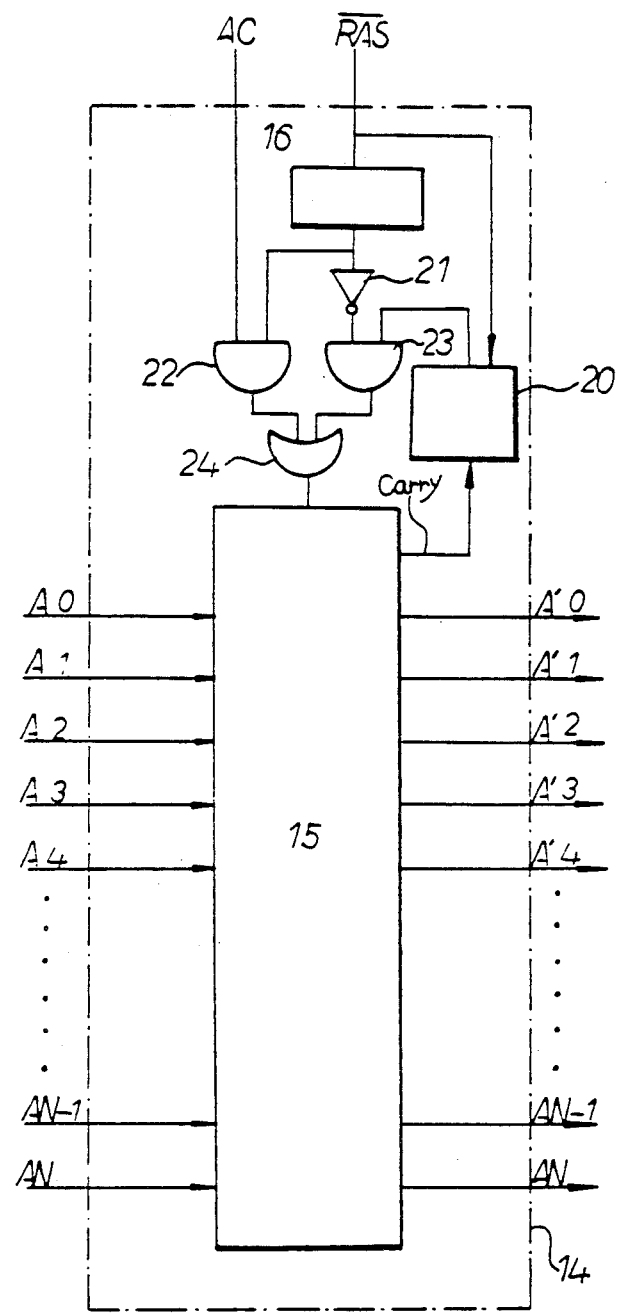
Figure 5:
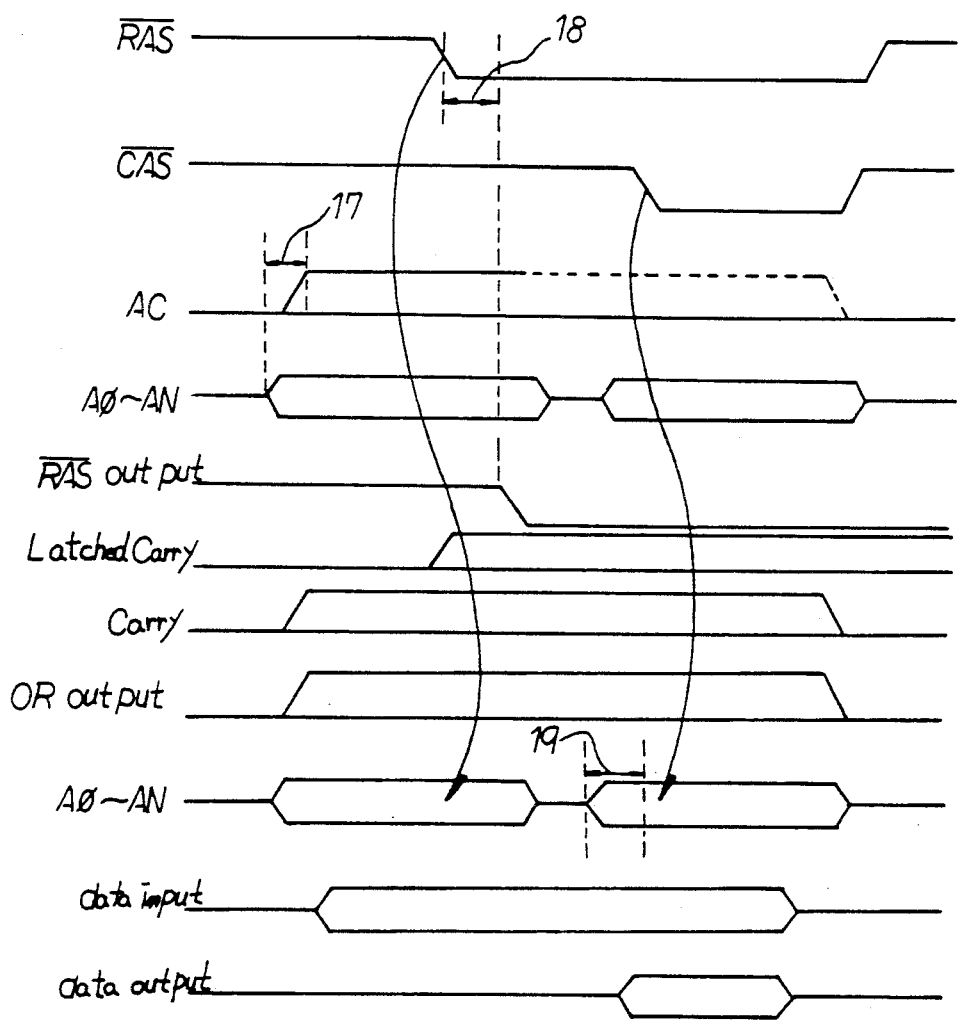
Figure 6:
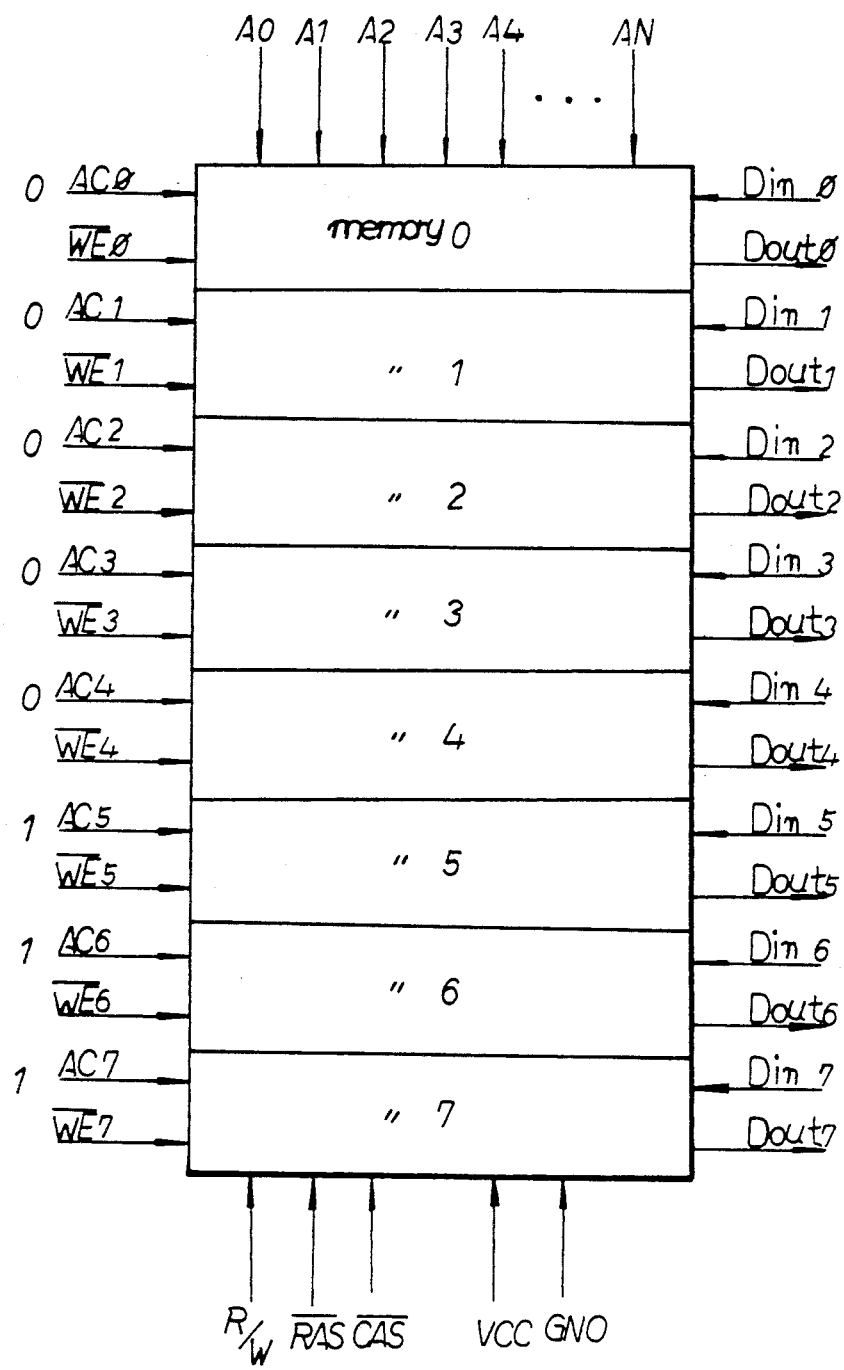

The invention will be described more in detail with reference to the accompanying drawings in which FIG. 1-a is a flow diagram BITBLT process in the bitmap formed by conventional 8-bit memories, FIG. 1-b is a flow diagram of BITBLT process in the bitmap according to the invention, FIG. 2 illustrates diagrammatically the constitution of a memory device having unmultiplexed inputs, FIG. 3 illustrates diagrammatically the constitution of a memory device having multiplexed inputs, FIG. 4 illustrates an embodyment of means for performing the address control function, FIG. 5 is a timing diagram useful for explaining the operating conditions of the means of FIG. 4, and FIG. 6 illustrates diagrammatically the constitution of the bitmap according to the invention.

In the drawings, 7 designates address bbbb+1, 8 and 13 designate address arithmetic units, 9 and 12 designate conventional memory cevices, 10 and 14 designate means for performing address control function, 11 designates a known memory device, 15 designates an adder, 16 designates a RAS delay circuit, 17 to 19 designate respectively time intervals of FIG. 5, AC designates an address control input, WE designates a write enable control input, R/W designates reading/writing operations, RAS designates row address select input, and CAS designates column address select input.

FIG. 2 illustrates the constitution of new memory device in which means 10 for performing address control function, is connected to the conventional memory device 9 having an unmultiplexed address input, an address control input (AC), data input and output parts, a R/W input indicating reading and writing conditions of data, a write enable (WE) input, and and a power (VCC) input.

In the memory device constituted in such a manner the means for performing address control function designates addresses Ao'-An' calculated by summing up address control input signal (AC) and addresses Ao-An, as the actual address, and enables data to be written into memory, thereby the memory device suitable to process image being provided.

As an embodiment of such operations, transferring operation of data from the area A to the area B will be described with reference to the flow diagram of BITBLT process of data shown in FIG. 1-b.

CPU or graphic processor reads out simultaneously the area 2 assigned to the address aaaa (4) of data 1 and the remaining area 3 assigned to the address aaaa+1 (5) of data D (1), stores the read out data into the register X, and writes two upper bits into the address bbbb (6) of the area B and the remaining 6 lower bits into the address bbbb+1 (7), and then increases the address aaaa(4) and the address bbbb (6) by one address respectively. Such procedures are performed repeatedly until all data in the area A are transferred to the area B, thereby the number of times of R/W of data are reduced, and shift operations in the inside of CPU or graphic processor becomes unnecessary, and thus more fast BITBLT process is obtained.

FIG. 3 illustrates the constitution of the memory device in which the additional means 14 for performing address control function is connected to the existing memory device having 1 bit input and output, R/W input indicating the reading and writing conditions of data, write enable control input (WE) enabling data to be written into memory 11, and power input, and in which lower and upper addresses entered seperately are recogn-ized in accordance with row address select input (RAS) signal and column address select input (CAS) signal, in this event, address inputs Ao-An are applied to the known memory 11 by RAS and CAS signals, in which address inputs Ao-An and control input(AC) entered prior to RAS signal first are summed up by address arithmetic unit 13, and then the summed addresses Ao'-An' are applied to the memory 11 by RAS signal.

In the event that there is carry generated when the address arithmetic unit 11 sums up these addresses, the carry first is stored into the flipflop in the arithmetic unit 13, and then summed with address being entered prior to entering of the CAS signal, and then the result of summing is applied to the memory 11 as the addresses Ao'-An' by the CAS signal.

For example, when address input is FFH address and AC input is 1, OOH address is applied to the memory 11 with the RAS signal. At this time, carry is generated. If address input is 55H, then 56H address summed with carry is applied to the memory 11 with the CAS signal.

FIG. 4 shows an embodiment of the means 14 for performing address control function in the memory device having multiplexed address inputs, and FIG. 5 is a timing diagram useful for explaining operating conditions of the means 14, in these drawings, 15 designates an adder, 20 designates a latch, 16 designates a RAS delay circuit, 17 designates a time interval from time of applying address input up to time of applying AC input, 18 designates a delay time between the RAS signal and the output signal of the RAS delay circuit 16, and 19 designates a time interval from time when the secondary input address is calculated, up to time when the CAS signal is applied. The arithmetic unit 13 performs control function of input address, and comprises a RAS delay circuit 16 for delay of the row address select signal (RAS), a AND gate 22 for performing AND operation of the address control input (AC) and the output of the RAS delay circuit (16), a latch circuit (20) in which the input data are triggered by RAS falling edge signal on the front end of the delay circuit, a AND gate 23 which inverts the output signal of the RAS delay circuit and performs AND operation of the inverted output and the output of the latch circuit 20, a OR gate 24 for performing OR operation of the output signals of these two AND gates, and an adder 15 which sums up the 1 bit input through the OR gate and N+1 bit address input and generates N+1 bit output and 1 bit carry output.

An another embodiment of the bitmap which consists of 8 memories of new type is shown in FIG. 6. Thus, 8 bit data of each of addresses Ao-An and addresses Ao-An+1 are get loaded on the data bus, and CPU or graphic processor performs BITBLT of these data through above described procedures.

The memory device having address control function which constitutes and operates as above described has its own acting effects as follows.

Firstly, the time required for BITBLT process is greatly reduced compared with that in the conventional memory device. In the event that the R/W period by quantitative analysis is 300 ns and the bitmap is constituted to read or write 16 pixels simultaneously, the time requires for BITBLT of 1 pixel is obtained by the following formula.

$$300 \times 16 \times 2 = 40 \text{ (ns)}$$

During this time interval, it is possible that the monitor having high resolution of 1000×1000 pixels is updated 25 times per second.

Secondary, total image process efficiency is greatly improved compared with that according to the method of processing image using the conventional memory device.

As above described, this invention provides the memory device which comprises the means for performing address control function connected to the conventional memory device, so that the problems such as the degrading of the speed and efficiency in image processing caused by use of the conventional memory device can be solved.

Accordingly, the memory device according to the invention is adaped is adapted to process image and has practical use and good performance.

The present invention may be embodied in other specific forms without departing from the spirit or scope thereof and, accordingly, reference should be made to the appended claims, rather than to foregoing specification, as indicating the scope of the invention.

What is claimed:

1. A memory device including a memory (9) having address input ports, data input and output ports, a R/W input port for indicating the reading and writing conditions of data, a WE input port enabling data to be written into the memory (9), and a power input port, said device further comprising:
    means (10) for performing an address control function of the memory (9), comprising:
        an address control input (AC) port;
        address input ports; and
        an address arithmetic unit (8) for summing up a value of address inputs and a value of an address control input (AC) and for applying the summing result value to the memory (9) as an address signal.

2. A memory device including a memory (12) having address input ports, a row address select signal (RAS) input port, a column address select signal (CAS) input port, data input and output ports, a R/W input port for indicating the reading and writing conditions of data, a WE input port enabling data to be written into the memory (12), and a power input port, said device further comprising:
    means (14) for performing an address control function of the memory, comprising:
        an address control input (AC) port;
        a row address select signal (RAS) input port;
        address input ports; and
        an address arithmetic unit (13) which sums up a value of an address control input (AC) and a value of an address input through the address input ports and applies the summing result value to the memory (12) as an address according to a row address select signal (RAS), and which sums up a value of a carry generated by said summing procedure and a value of an address input through the address input ports and applies the summing result value to the memory (12) as an address according to a column address select signal (CAS).

3. A memory device including a memory (12) having address input ports, a row address select signal (RAS) input port, a column address select signal (CAS) input port, data input and output ports, a R/W input port for indicating the reading and writing conditions of data, a WE input port enabling data to be written into the memory (12), and a power input port, said device further comprising:
    an address control input (AC) line;
    a row address select signal (RAS) input line;
    address input lines;
    a RAS delay circuit (16) connected to the row adrress select signal an RAS input line;
    a first AND logic means (22) connected to the address control input (AC) line and an output of the RAS delay circuit (16);
    an inverter (21) connected to the output of the RAS delay circuit (16);
    a second AND logic means (23) connected to the inverter (21);
    an OR logic means (24) connected to the first and second logic means (22) and (23);
    a latch circuit (20) connected to an input of the second logic means (23) and the row address select signal (RAS) input line; and
    an adder connected to the OR logic means (24), the latch circuit (20), the address input lines, and the memory (12).

* * * * *

UNITED STATES PATENT AND TRADEMARK OFFICE
CERTIFICATE OF CORRECTION

PATENT NO. : 5,058,064
DATED : October 15, 1991
INVENTOR(S) : Hahm et al.

It is certified that error appears in the above-identified patent and that said Letters Patent is hereby corrected as shown below:

In column 3 at line 40 change "parts," to --ports,--;

In column 4 at line 8 change "seperately" to --separately--.

Signed and Sealed this

Fourth Day of July, 1995

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.   : 5,058,064
DATED        : October 15, 1991
INVENTOR(S)  : Hahm et al.

It is certified that error appears in the above-identified patent and that said Letters Patent is hereby corrected as shown below:

Title page,
Item [73], Assignee, please delete "Electronics and Tekcommunications Research Institute, Rep. of Korea" and insert -- Electronics and Telecommunications Research Institue, Yuseong-Ku Daejeon; Korea Telecommunication Authority, Seoul both of Rep. of Korea --.

Signed and Sealed this

Twenty-second Day of October, 2002

Attest:

JAMES E. ROGAN
Attesting Officer   Director of the United States Patent and Trademark Office